(12) United States Patent
Lee et al.

(10) Patent No.: US 8,049,117 B2
(45) Date of Patent: Nov. 1, 2011

(54) METHOD FOR MANUFACTURING A PRINTED CIRCUIT BOARD WITH A THIN FILM CAPACITOR EMBEDDED THEREIN HAVING A DIELECTRIC FILM BY USING LASER LIFT-OFF, AND PRINTED CIRCUIT BOARD WITH A THIN FILM CAPACITOR EMBEDDED THEREIN MANUFACTURED THEREBY

(75) Inventors: Jung Won Lee, Seoul (KR); Yul Kyo Chung, Gyunggi-Do (KR); In Hyung Lee, Seoul (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 222 days.

(21) Appl. No.: 12/466,841

(22) Filed: May 15, 2009

(65) Prior Publication Data

US 2009/0223706 A1 Sep. 10, 2009

Related U.S. Application Data (62) Division of application No. 11/808,298, filed on Jun. 8, 2007.

(30) Foreign Application Priority Data

Jul. 19, 2006 (KR) .................. 10-2006-0067188

(51) Int. Cl.
*H05K 1/16* (2006.01)

(52) U.S. Cl. .......... 174/260; 174/261; 361/280; 29/852; 257/275; 257/306; 257/310; 257/532; 257/778; 438/96; 438/166; 438/197; 438/240; 438/455; 438/458; 438/627; 438/795

(58) Field of Classification Search .................. 174/260, 174/261; 361/280; 29/852; 257/275, 306, 257/310, 532, 778; 438/96, 166, 197, 240, 438/455, 458, 627, 795
See application file for complete search history.

(56) References Cited

U.S. PATENT DOCUMENTS 3,615,875 A 10/1971 Morita et al.
(Continued)

FOREIGN PATENT DOCUMENTS

CN 1741707 A 3/2006
(Continued)

OTHER PUBLICATIONS

United States Office Action issued in U.S. Appl. No. 11/808,298 dated Feb. 3, 2010.

(Continued)

*Primary Examiner* — Xiaoliang Chen
(74) *Attorney, Agent, or Firm* — McDermott Will & Emery LLP (57) ABSTRACT

A method for manufacturing a printed circuit board with a capacitor embedded therein which has a dielectric film using laser lift off, and a capacitor manufactured thereby. In the method, a dielectric film is formed on a transparent substrate and heat-treated. A first conductive layer is formed on the heat-treated dielectric film. A laser beam is irradiated onto a stack formed, from below the transparent substrate, to separate the transparent substrate from the stack. After the transparent substrate is separated from the stack, a second conductive layer is formed with a predetermined pattern on the dielectric film. Also, an insulating layer and a third conductive layer are formed on the first and second conductive layers to alternate with each other in a predetermined number.

16 Claims, 7 Drawing Sheets

U.S. PATENT DOCUMENTS

| | | | |
|---|---|---|---|
| 4,305,973 A * | 12/1981 | Yaron et al. | 427/554 |
| 4,370,510 A | 1/1983 | Stirn | |
| 4,542,578 A | 9/1985 | Yamano et al. | |
| 5,008,513 A | 4/1991 | Najafi-Sani et al. | |
| 5,231,751 A * | 8/1993 | Sachdev et al. | 29/852 |
| 5,261,153 A | 11/1993 | Lucas | |
| 5,484,686 A | 1/1996 | Maeda et al. | |
| 5,631,895 A | 5/1997 | Okada et al. | |
| 5,780,873 A | 7/1998 | Itaya et al. | |
| 5,810,945 A | 9/1998 | Stutzmann et al. | |
| 5,946,562 A | 8/1999 | Kuo | |
| 5,990,507 A | 11/1999 | Mochizuki et al. | |
| 6,091,026 A | 7/2000 | Yang | |
| 6,177,151 B1 * | 1/2001 | Chrisey et al. | 427/596 |
| 6,194,650 B1 | 2/2001 | Wakayama et al. | |
| 6,258,449 B1 | 7/2001 | Nagasawa | |
| 6,316,339 B1 | 11/2001 | Okusa et al. | |
| 6,416,837 B1 | 7/2002 | Kojima et al. | |
| 6,456,584 B1 | 9/2002 | Nagata et al. | |
| 6,521,511 B1 | 2/2003 | Inoue et al. | |
| 6,541,137 B1 | 4/2003 | Kingon et al. | |
| 6,632,314 B1 * | 10/2003 | Yu et al. | 156/241 |
| 6,642,091 B1 | 11/2003 | Tanabe | |
| 6,677,173 B2 | 1/2004 | Ota | |
| 6,696,326 B2 | 2/2004 | Zhang et al. | |
| 6,835,531 B1 | 12/2004 | Yoon et al. | |
| 6,841,217 B2 | 1/2005 | Nishihara et al. | |
| 6,841,883 B1 | 1/2005 | Farnworth et al. | |
| 6,902,716 B2 | 6/2005 | Lee et al. | |
| 7,067,198 B2 | 6/2006 | Yamada et al. | |
| 7,081,642 B2 | 7/2006 | Onozuka et al. | |
| 7,150,865 B2 | 12/2006 | Harutyunyan et al. | |
| 7,309,395 B2 | 12/2007 | Lee et al. | |
| 7,356,060 B2 | 4/2008 | Mochida | |
| 7,435,675 B2 * | 10/2008 | Seh et al. | 438/623 |
| 7,495,177 B2 | 2/2009 | Kataoka et al. | |
| 2001/0012257 A1 | 8/2001 | Suzuki et al. | |
| 2002/0004124 A1 | 1/2002 | Hirasawa et al. | |
| 2002/0052069 A1 | 5/2002 | Jiroku et al. | |
| 2002/0117199 A1 | 8/2002 | Oswald | |
| 2002/0168475 A1 | 11/2002 | Yamaji et al. | |
| 2003/0040164 A1 | 2/2003 | Inoue et al. | |
| 2003/0044539 A1 * | 3/2003 | Oswald | 427/404 |
| 2003/0049913 A1 | 3/2003 | Gaku et al. | |
| 2003/0071300 A1 | 3/2003 | Yashima et al. | |
| 2003/0197214 A1 * | 10/2003 | Hartzell | 257/306 |
| 2003/0216538 A1 | 11/2003 | Kawano et al. | |
| 2004/0062858 A1 | 4/2004 | Sato et al. | |
| 2004/0075388 A1 | 4/2004 | Miyashita et al. | |
| 2004/0110395 A1 | 6/2004 | Ueda et al. | |
| 2004/0121529 A1 | 6/2004 | Sohn et al. | |
| 2004/0241487 A1 * | 12/2004 | Nagatani | 428/606 |
| 2005/0012221 A1 | 1/2005 | Kirby et al. | |
| 2005/0056942 A1 | 3/2005 | Pogge et al. | |
| 2005/0056943 A1 * | 3/2005 | Pogge et al. | 257/778 |
| 2005/0074694 A1 | 4/2005 | Nishihara et al. | |
| 2005/0082636 A1 * | 4/2005 | Yashima et al. | 257/532 |
| 2005/0167663 A1 | 8/2005 | Sasaki | |
| 2005/0207331 A1 | 9/2005 | Shinkai et al. | |
| 2005/0281304 A1 * | 12/2005 | Mochida | 372/46.01 |
| 2006/0018241 A1 | 1/2006 | Shingai et al. | |
| 2006/0044734 A1 | 3/2006 | Ahn et al. | |
| 2006/0068563 A1 | 3/2006 | Wong et al. | |
| 2006/0076584 A1 * | 4/2006 | Kim et al. | 257/275 |
| 2006/0099747 A1 * | 5/2006 | Park | 438/158 |
| 2006/0130956 A1 | 6/2006 | White et al. | |
| 2006/0231853 A1 | 10/2006 | Tanaka | |
| 2007/0065759 A1 | 3/2007 | Kitaura et al. | |
| 2009/0003174 A1 | 1/2009 | Tsuchino et al. | |
| 2009/0140255 A1 | 6/2009 | Kimura et al. | |
| 2009/0261347 A1 * | 10/2009 | Kasu et al. | 257/77 |

FOREIGN PATENT DOCUMENTS

| | | |
|---|---|---|
| JP | 2002-222773 | 8/2002 |
| JP | 2003-347587 A | 12/2003 |
| JP | 2004-072052 | 3/2004 |
| JP | 2006-179910 | 7/2006 |
| JP | 2006-179911 A | 7/2006 |

OTHER PUBLICATIONS

Chinese Office Action, w/ English translation thereof, issued in Chinese Patent Application No. CN 200710108648.0 dated Jan. 29, 2010.

Japanese Decision of Rejection, with English translation, issued in Japanese Patent Application No. 2007-144890, mailed Mar. 16, 2010.

United States Office Action issued in U.S. Appl. No. 11/808,298, mailed May 25, 2010.

Japanese Office Action issued in Japanese Patent Application No. JP 2007-144890 dated Aug. 11, 2009.

United States Office Action issued in U.S. Appl. No. 11/808,298 dated Oct. 5, 2009.

United States Office Action issued in U.S. Appl. No. 12/466,770 dated Feb. 23, 2011.

United States Office Action issued in U.S. Appl. No. 11/808,298 dated Feb. 17, 2011.

* cited by examiner

Laser (d)

METHOD FOR MANUFACTURING A PRINTED CIRCUIT BOARD WITH A THIN FILM CAPACITOR EMBEDDED THEREIN HAVING A DIELECTRIC FILM BY USING LASER LIFT-OFF, AND PRINTED CIRCUIT BOARD WITH A THIN FILM CAPACITOR EMBEDDED THEREIN MANUFACTURED THEREBY

CLAIM OF PRIORITY

This application is a divisional of U.S. patent application Ser. No. 11/808,298, filed Jun. 8, 2007, claims the benefit of Korean Patent Application No. 2006-67188 filed on Jul. 19, 2006 in the Korean Intellectual Property Office, the disclosure of each of which are incorporated herein by reference.

BACKGROUND OF THE INVENTION

1. Field of the Invention

The present invention relates to a method for manufacturing a printed circuit board with a thin film capacitor embedded therein using laser lift-off, and more particularly, to a method for manufacturing a printed circuit board with a thin film capacitor embedded therein which has a dielectric film using laser lift off, and a printed circuit board with a thin film capacitor embedded therein manufactured thereby.

2. Description of the Related Art

With a smaller, lighter, higher-speed and higher-frequency trend of electronic devices, the electronic devices are increasingly required to possess higher-density. In reality, vigorous studies have been conducted on technologies to integrate passive and/or active devices into a substrate. Also, in ongoing researches to reduce size of the electronic devices, many passive devices such as a resistor, a capacitor and an inductor are embedded in a printed circuit board (PCB) instead of being installed thereon. Out of these passive devices, the capacitor accounts for a considerable proportion of about 60%. Thus, much attention is drawn on an embedded capacitor. As described above, the capacitor is embedded in the PCB instead of being installed thereon. This downscales size of the passive device by 40% and assures better electrical properties at a higher frequency due to low impedance (<10 pH).

The conventional embedded capacitor is disclosed in U.S. Pat. No. 5,261,153. The document teaches a method for manufacturing a printed circuit board with a capacitor embedded therein by lamination of conductive foils and uncured dielectric sheets alternating therewith. Moreover, U.S. Pat. No. 6,541,137 discloses a high temperature thin film embedded capacitor using dielectrics. Specifically, the document proposes a barrier layer for preventing the conductive layer from oxidizing from high temperature heat treatment of 400° C.- to 800° C.

However, in this embedded capacitor, a dielectric film is necessarily made of a dielectric material having a high dielectric constant selected from a group consisting of barium strontium titanate (BSTO), barium titanate (BT), lead zirconium titanate (PZT), barium zirconium titanate (BZTO), and tantalum titanate (TTO). This dielectric material should be excellent in crystallinity to exhibit high dielectric constant. To this end, the dielectric material should be heat-treated at a temperature of 500° C. or more.

But in the conventional embedded capacitor, a thin film is formed on an electrode as an RCC type and crystallized through heat treatment to impart a certain dielectric constant to a capacitor product. Then these materials are employed in a PCB process. However, the materials need heat-treating at a high temperature of 400° C. to 800° C., and are hardly configured on a resin-containing PCB.

Figure 1:
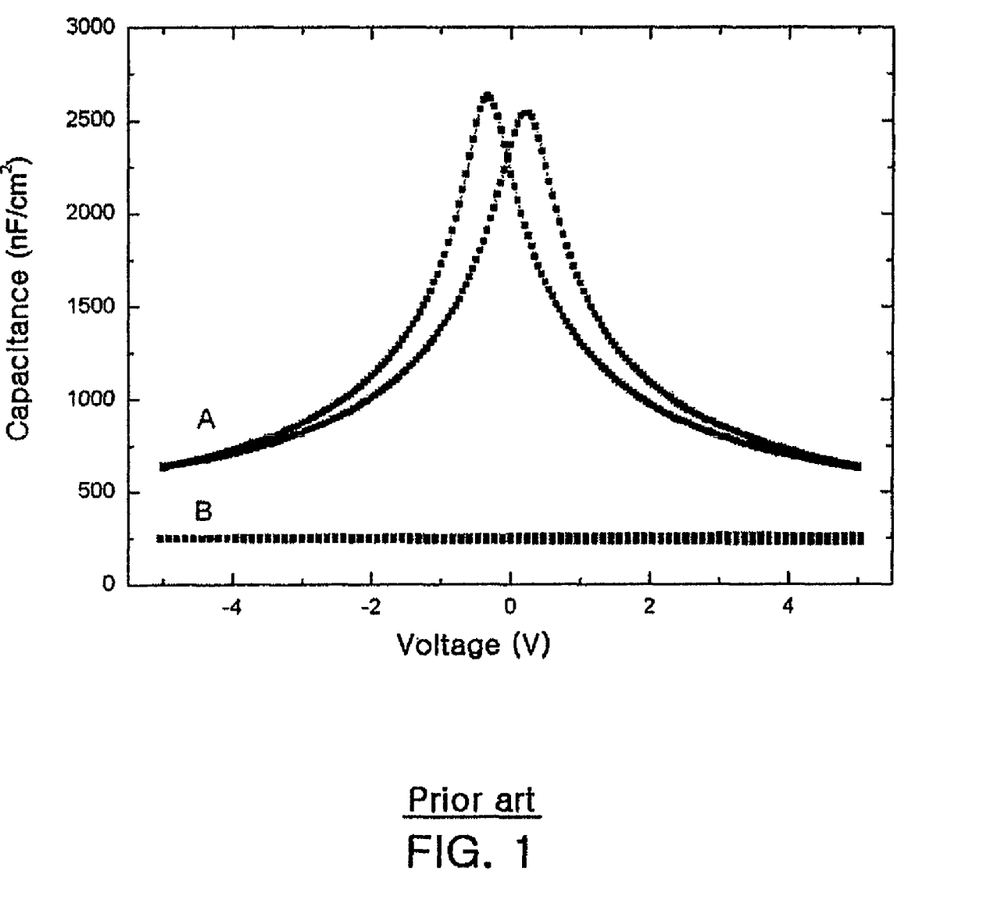
FIG. 1 is a graph illustrating capacitance of a Pb-based dielectric film formed on a copper foil coated with a nickel oxidation prevention layer and a dielectric film formed on a Pt/Ti/SiO$_2$/Si substrate, respectively.

Dielectric properties of the thin film capacitor are greatly affected by the type of the substrate, as is apparent from FIG. 1. FIG. 1 demonstrates capacitance of a Pb-based dielectric film deposited on two types of substrates with respect to a voltage applied. A copper foil and a Pt/Ti/SiO$_2$/Si substrate are adopted for the substrates, and heat treated in the air at 650° C. for 30 minutes. The dielectric film is deposited to a thickness of 0.6 micrometer. The dielectric film on the cooper foil exhibits capacitance of 0.2 µF/cm$^2$, much lower than the dielectric film on the Pt/Ti/SiO$_2$/Si substrate whose capacitance is 2.5 µF/cm$^2$. The dielectric film deposited on the copper foil is affected by an oxidized interface resulting from oxidation of the copper foil which is heat-treated along with the substrate. This prevents the dielectric film on the copper foil from manifesting properties peculiar to the dielectric material.

Therefore, studies have been conducted unceasingly to prevent the copper foil from oxidization in two methods. That is, a heat-treatment atmosphere has been regulated or a strong oxidation-resistant nickel layer has been formed on the copper foil to deposit and heat-treat the dielectric film. These methods however entail a problem of decreased capacitance of the capacitor manufactured.

As a result, there has arisen a demand for developing a method for manufacturing a capacitor with a printed circuit board embedded therein having a dielectric film that needs heat-treating at a high-temperature through a general PCB manufacturing process.

SUMMARY OF THE INVENTION

The present invention has been made to solve the foregoing problems of the prior art and therefore an aspect of the present invention is to provide a method for manufacturing a printed circuit board with a capacitor embedded therein having a dielectric film using laser lift-off, and a printed circuit board with a thin film capacitor embedded therein manufactured thereby.

According to an aspect of the invention, the invention provides a method for manufacturing a printed circuit board with a thin film capacitor embedded therein, the method including:

forming a dielectric film on a transparent substrate and heat-treating the dielectric film;

forming a first conductive layer on the heat-treated dielectric film;

irradiating a laser beam onto a stack formed, from below the transparent substrate, to separate the transparent substrate from the stack;

after the transparent substrate is separated from the stack, forming a second conductive layer with a predetermined pattern on the dielectric film; and forming an insulating layer and a third conductive layer on the first and second conductive layers to alternate with each other in a predetermined number.

According to another aspect of the invention, the invention provides a method for manufacturing a printed circuit board with a thin film capacitor embedded therein, the method including:

forming a dielectric film on a transparent substrate and heat-treating the dielectric film;

forming a first conductive layer on the heat-treated dielectric film;

forming an insulating layer on the conductive layer and stacking a copper clad laminate on the insulating layer;

irradiating a laser beam onto a stack formed, from below the transparent substrate, to separate the transparent substrate from the stack; and after transparent substrate is separated from the stack, forming a second conductive layer with a predetermined pattern on the dielectric film.

According to further another aspect of the invention, the invention provides a method for manufacturing a printed circuit board with a thin film capacitor embedded therein, the method including:

forming a dielectric film on a transparent substrate and heat-treating the dielectric film;

forming a first conductive layer on the heat-treated dielectric film;

stacking a resin coated copper on the conductive layer;

irradiating a laser beam onto a stack formed, from below the transparent substrate, to separate the transparent substrate from the stack;

after the transparent substrate is separated from the stack, forming a second conductive layer with a predetermined pattern on the dielectric film; and forming an insulating layer and a third conductive layer on the RCC film and the second conductive layer to alternate with each other in a predetermined number.

According to further another aspect of the invention, the invention provides a printed circuit board with a thin film capacitor embedded therein manufactured as described above.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 2:
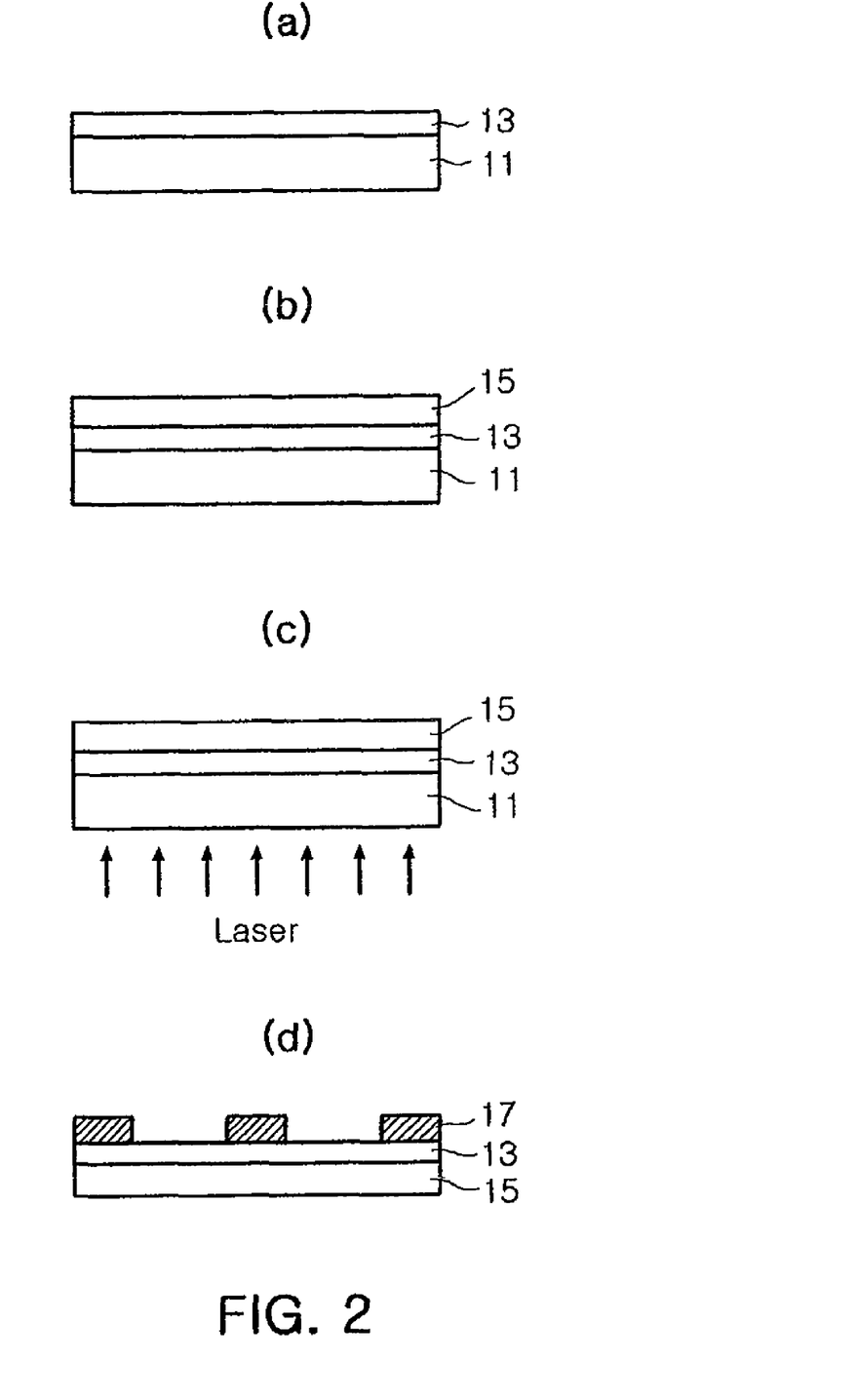
FIG. 2 is a view illustrating a method for manufacturing a printed circuit board with a thin film capacitor embedded therein according to an embodiment of the invention.

FIG. 2 is a schematic view illustrating a method for manufacturing a printed circuit board with a thin film capacitor embedded therein according to an embodiment of the invention.

As shown in FIG. 2(a), according to the invention, first, a laser-transmissible transparent substrate 11 is prepared, and then a dielectric film 13 is formed thereon. In this invention, a material for the transparent substrate 11 is not limited to a specific type. But the transparent substrate 11 is made of preferably one selected from a group consisting of sapphire, quartz, glass, MgO, lanthanum aluminate (LaAlO$_3$), fused silica, and zirconia (YSZ).

Also, according to the invention, the dielectric film 13 may be formed by a general sol-gel process using a metal organic precursor exhibiting superior dielectric properties by high-temperature heat treatment. Meanwhile, according to the invention, the dielectric film 13 has various dielectric compositions exhibiting superior dielectric properties through high-temperature heat treatment. However, the dielectric film 13 is not limited to a specific composition and type. For example, the dielectric film 13 can be made of a dielectric material containing volatile elements of e.g., Bi or Pb which is selected from a group consisting of lead zirconium titanate (PZT), barium titanate (BT), strontium bismuth tantalate (SBT), bismuth lanthanum titanate (BLT), lead magnesium niobate-lead titanate (PMN-PT), and lead zinc niobate-lead titanate (PZN-PT), or a dielectric material having a dopant added thereto.

Next, according to the invention, the dielectric film 13 is heat treated. The heat-treatment improves crystallinity of the thin film and assures superior dielectric properties thereof. Preferably, the dielectric film 13 is heat treated at a temperature of 400° C. or more, and more preferably, at a temperature ranging from 500° C. to 700° C.

Thereafter, according to the invention, as shown in FIG. 2(b), a first metal conductive layer 15 is formed on the heat-treated dielectric film 13 to serve as an electrode of the thin film capacitor. The conductive layer 15 may be composed of various conductive metals or oxidants. Preferably, the conductive layer 15 is made of one selected from a group consisting of, for example, Au, Ag, Ni, Cu, Al, Pt, Ti, Ir, IrO$_2$, Ru and RuO$_2$. Moreover, the first conductive layer 15 can be formed by a general process selected from a group consisting of PVD, CVD, ALD, screen printing, plating and inkjet printing. Preferably, the first conductive layer 15 is formed by the PVD using sputtering or e-beam. More preferably, the first conductive layer 15 is formed by sputtering. Alternatively, the first conductive layer 15 may be formed by forming a metal seed layer by PVD and electrolytically plating the metal seed layer.

According to the invention, optionally, the first conductive layer 15 may have a predetermined pattern. In order to form this pattern, the first conductive layer 15 is formed via a mask by a process selected from PVD, CVD, ALD, screen printing, plating and inkjet printing. Alternatively, a sensitive film is applied on the first conductive layer by a predetermined process, and then the pattern is attained by a general process of exposure and development.

Furthermore, according to the invention, a bonding layer or a barrier layer may be disposed between the dielectric film 13 and the first conductive layer 15. This ensures the dielectric film 13 and the first conductive layer 15 to be more bonded together or prevents the first metal conductive layer 15 from diffusion and oxidization. Such a bonding layer or barrier layer can be formed by sputtering Ti or Cr.

Also, according to the invention, as shown in FIG. 2(*c*), a laser beam is irradiated onto a stack formed, from below the transparent substrate 11, to separate the transparent substrate 11 from the stack. That is, the laser beam irradiated from below the transparent substrate 11 locally increases temperature of an interface between the substrate 11 and the dielectric film 13. This renders some portions of the dielectric film elements volatile, thus allowing the substrate 11 to be effectively separated from the dielectric film 13. For example, in a case where a dielectric film having a composition of Pb-based $PbZrTiO_3$ (110/52/48) is deposited on the sapphire substrate, an excimer laser beam (248 nm) may be irradiated onto an interface between the PZT thin film and the sapphire substrate at an intensity of 400 $mJ/cm^2$. This increases temperature of the interface between the substrate and the dielectric film to at least 1350° c., which is higher than a melting point of PZT. Thus volatile PbO elements are formed at the interface between the substrate and the dielectric film, leading to separation of the transparent substrate 11 from the dielectric film 13.

This invention is not limited to a specific type of the laser and an irradiation method. For example, an excimer laser (126 nm, 146 nm, 157 nm, 172 nm, 175 nm, 193 nm, 248 nm, 282 nm, 308 nm, 351 nm, 222 nm, and 259 nm) can be adopted to separate the substrate 11 as described above. Alternatively, an Nd YAG laser (266 nm, 355 nm) may be employed. The Nd YAG laser has a wavelength corresponding to the energy band gap between a dielectric film and a transparent substrate. That is, various types of lasers can be utilized to separate the substrate as long as the laser energy that passed the transparent substrate is absorbed in the dielectric film to increase temperature of the interface between the dielectric film and the substrate to at least a melting point of the dielectric film. A laser beam used at this time can be modified into various beam profiles such as spot, square and line.

Meanwhile, when the substrate 11 is separated by an excimer laser or an Nd YAG laser, a portion of the dielectric film 13 adjacent to the substrate 11, which is exposed to heat of the laser, may have a transformation from a crystalline into an amorphous structure to a small thickness (about 108 nm), thus producing a damaged layer. This damaged layer may degrade dielectric properties of the dielectric film. For example, the PZT film transferred onto a PCB may have a dielectric constant ranging from 1 MHz to 600 MHz. However, the PZT film with this damaged layer can provide a higher capacitance than the PZT film formed on the copper foil, and thus be suitably applied.

But to ensure much better dielectric properties, preferably, the damaged layer should be removed. The damaged layer can be removed by various processes such as wet etching and ion beam milling, without being limited to a specific process.

To preclude a possibility of the damaged layer, preferably a Femto laser beam is irradiated onto the stack, from below the substrate, to separate the transparent substrate 11 from the stack. For example, the Femto laser beam (800 nm, 300 fs), when employed to separate the substrate 11, can effectively prevent formation of the damaged layer caused by laser irradiation. In consequence, the PZT film transferred onto the PCB manufactured as described above maintains a tetragonal crystal structure, thereby exhibiting a superior dielectric constant ranging from 1 MHz to 1600 MHz.

Next, as shown in FIG. 2(*d*), after the transparent substrate 11 is separated from the stack, a second metal conductive layer 17 with a predetermined pattern is formed on the dielectric film 13 to serve as another electrode. This second conductive layer 17 may be made of various conductive metals or oxidants. Preferably, the second conductive layer 17 is made of one selected from a group consisting of Au, Ag, Ni, Cu, Al, Pt, Ti, Ir, $IrO_2$, Ru, and $RuO_2$. Also, the second conductive layer 17 is formed by a general process selected from a group consisting of PVD, CVD, ALD, screen printing, plating and inkjet printing. Preferably, the second conductive layer 17 is formed by the PVD using sputtering or e-beam, and more preferably, sputtering. Alternatively, the second conductive layer 17 is formed by forming a metal seed layer by the PVD and electrolytically plating the metal seed layer.

The second metal conductive layer 17 may be formed to have a predetermined pattern via a mask using the PVD. Alternatively, a sensitive film is applied on the first conductive layer by a predetermined process, and then the pattern is attained by a general process of exposure and development.

Subsequently, according to the invention, an insulating layer and a third conductive layer are formed on the first and second conductive layers to alternate with each other in a predetermined number by adopting a typical manufacturing method of a printed circuit board. This produces a printed circuit board with a dielectric thin fin film capacitor embedded therein.

Figure 3:
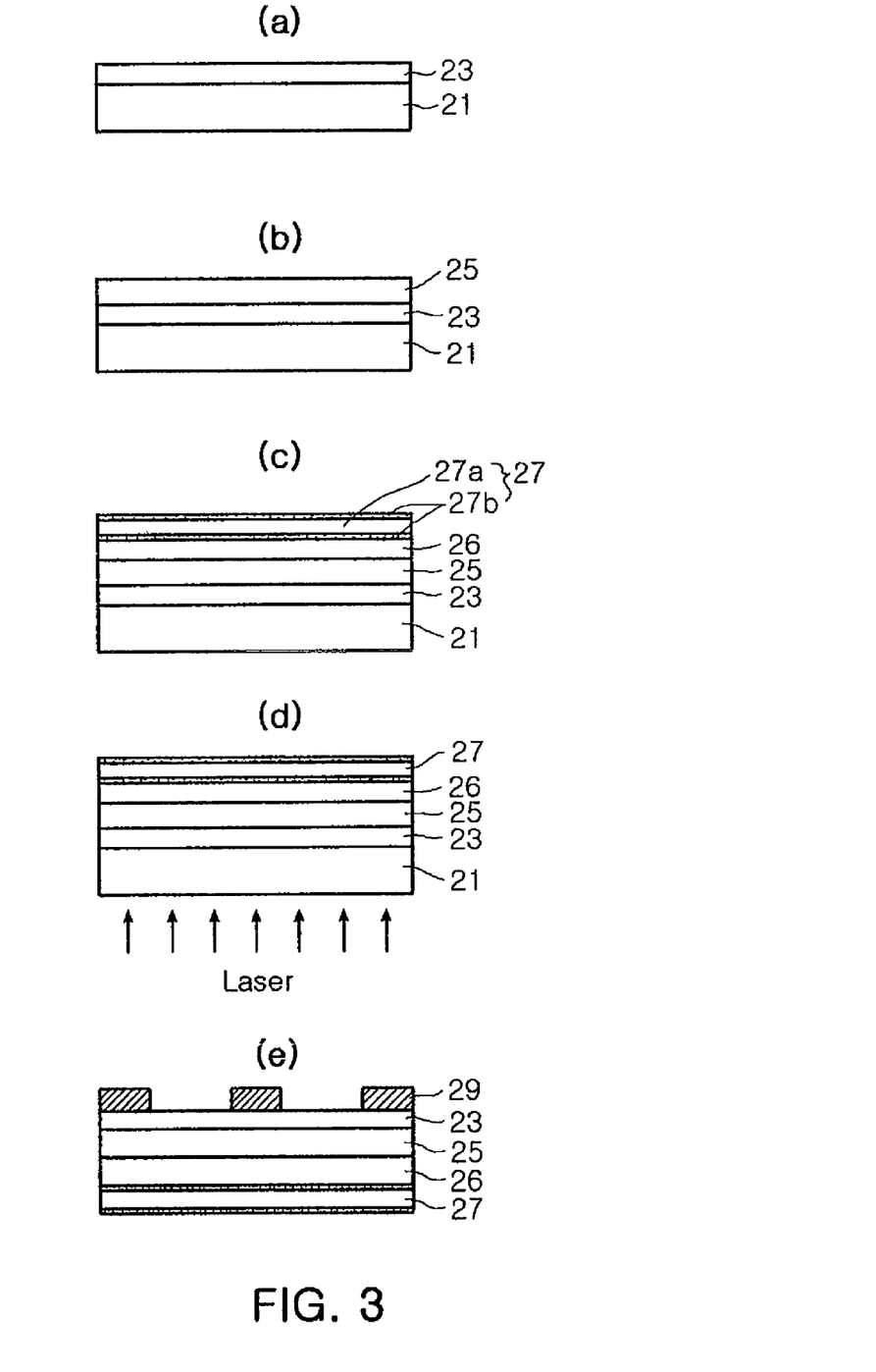
FIG. 3 is a view illustrating a method for manufacturing a printed circuit board with a thin film capacitor embedded therein according to another embodiment of the invention.

FIG. 3 is a schematic view illustrating a method for manufacturing a printed circuit board with a thin film capacitor embedded therein according to another embodiment of the invention.

As shown in FIG. 3(*a*), according to the invention, a dielectric film 23 is formed on a transparent substrate 21 and heat-treated. As shown in FIG. 3(*b*), a first metal conductive layer 25 is formed on the heat-treated dielectric film 23 to serve as an electrode of the capacitor. Optionally, this first conductive layer 25 has a predetermined pattern. The composition, forming method and patterning of the first conductive layer 25 have been described above and thus will be explained in no more detail.

Also, as described above, a bonding layer or a barrier layer may be formed between the dielectric film 23 and the first conductive layer 25 to improve bonding therebetween and prevent the first metal conductive layer 25 from diffusion or oxidization.

Afterwards, according to the invention, as shown in FIG. 3(*c*), an insulating layer 26 is stacked on the conductive layer 25. The insulating layer is typically composed of a polymer resin but can be made of various insulating materials used in a PCB manufacturing process.

Moreover, according to the invention, a copper clad laminate (CCL) 27 is stacked on the insulating layer 26. The CCL 27 has an insulating member 27*b* attached with copper foils 27*a* at both surfaces thereof.

Next, as shown in FIG. 3(*d*), a laser beam is irradiated onto a stack formed, from below the transparent substrate 21, to separate the transparent substrate 21 from the stack. An explanation has been given previously about a process for separating the transparent substrate through a laser beam, and type of the laser and subsequent operations, which thus will be explained in no more detail.

Moreover, as shown in FIG. 3(*e*), after the transparent substrate 21 is separated from the stack, a second conductive layer 29 with a predetermined pattern is formed on the dielectric film 23 under the same conditions as described above.

This second metal conductive layer 29 serves as an electrode of the thin film capacitor. Here, the composition and forming method of the metal conductive layer 29 have been described above and thus will not be explained further.

Thereafter, according to the invention, an insulating layer and a third conductive layer are formed on the CCL 27 and the conductive layer 29 to alternate with each other in a predetermined number by adopting a general manufacturing method of a printed circuit board.

Figure 4:
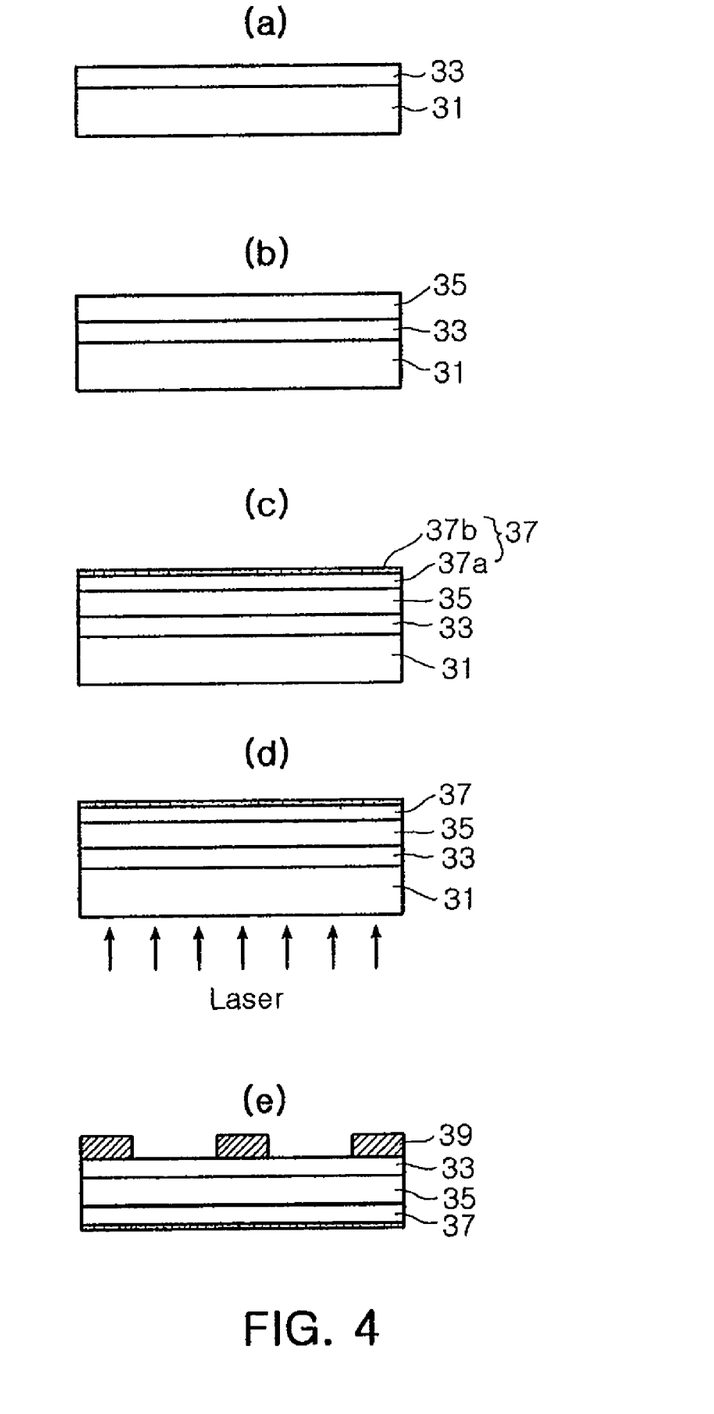
FIG. 4 is a view illustrating a method for manufacturing a printed circuit substrate with a thin film capacitor embedded therein according to further another embodiment of the invention.

Meanwhile, FIG. 4 is a schematic view illustrating a method for manufacturing a printed circuit board with a thin film capacitor embedded therein according to further another embodiment of the invention.

As shown in FIG. 4(a), a dielectric film 33 is formed on a transparent substrate 31 and heat-treated. Then as shown in FIG. 4(b), a first metal conductive layer 35 is formed on the heat-treated dielectric film 33 to serve as an electrode of the capacitor. Optionally, the first conductive layer 35 has a predetermined pattern. The composition and forming method of the conductive layer 35 have been described above and thus will be explained in no more detail.

Furthermore, as described above, a bonding layer or a barrier layer may be formed between the dielectric film 33 and the first conductive layer 35 to improve bonding therebetween and prevent the first metal conductive layer 35 from diffusion and oxidization.

According to the invention, as shown in FIG. 4(c), a resin coated copper (RCC) 37 is stacked on the first conductive layer 35. The RCC has a copper foil 37a attached with a resin 37b.

Then, as shown in FIG. 4(d), a laser beam is irradiated onto a stack formed, from below the transparent substrate 31, to separate the transparent substrate 31 from the stack. An explanation has been given previously about a process of separating the transparent substrate by a laser beam, and type of the laser and subsequent operations, which thus will not be explained further.

Also, as shown in FIG. 4(e), after the transparent substrate 31 is separated from the stack, a second conductive layer 39 with a predetermined pattern is formed on the dielectric film 33 under the same conditions as described above.

Thereafter, according to the invention, an insulating layer and a conductive layer are formed on the RCC 37 and the second conductive layer 39 to alternate with each other in a predetermined number by a general manufacturing method of a printed circuit board. This produces a printed circuit board with a dielectric film capacitor embedded therein.

As described above, the printed circuit board with a thin film capacitor embedded therein has a dielectric film using laser lift-off and can be manufactured effectively in a general PCB manufacturing process.

The invention will be explained in detail by way of example.

EXAMPLE

A dielectric material of PbZrTiO$_3$ (Zr/Ti=52/48, 10% Pb excess) was spin coated on a sapphire transparent substrate at a thickness of 0.4 micrometer by general sol-gel, and heat-treated in the air at a temperature of 650° C. This produced a crystallized PZT dielectric film on the transparent sapphire substrate. Then, a first Au metal layer was formed on the dielectric film by sputtering and an insulating layer made of an epoxy resin was formed on the conductive layer.

Thereafter, a copper clad laminate was disposed on the insulating layer and lamination was performed. Then, an excimer laser beam (308 nm) was irradiated onto a stack formed, from below the transparent sapphire substrate, to separate the transparent substrate from the stack. Here, the excimer laser beam was shaped as a line and had an energy of 400 mJ/cm$^2$ (308 nm). The laser beam had a size of 370 mm×400 μm, and was irradiated at a repetition rate of 10 Hz and for a pulse duration of 30 nsec. Also, after the transparent substrate was separated from the stack, a second Au conductive layer was formed by sputtering on the PZT dielectric film. This produced a capacitor with a structure of metal conductive layer/dielectric film/metal conductive layer.

Figure 5:
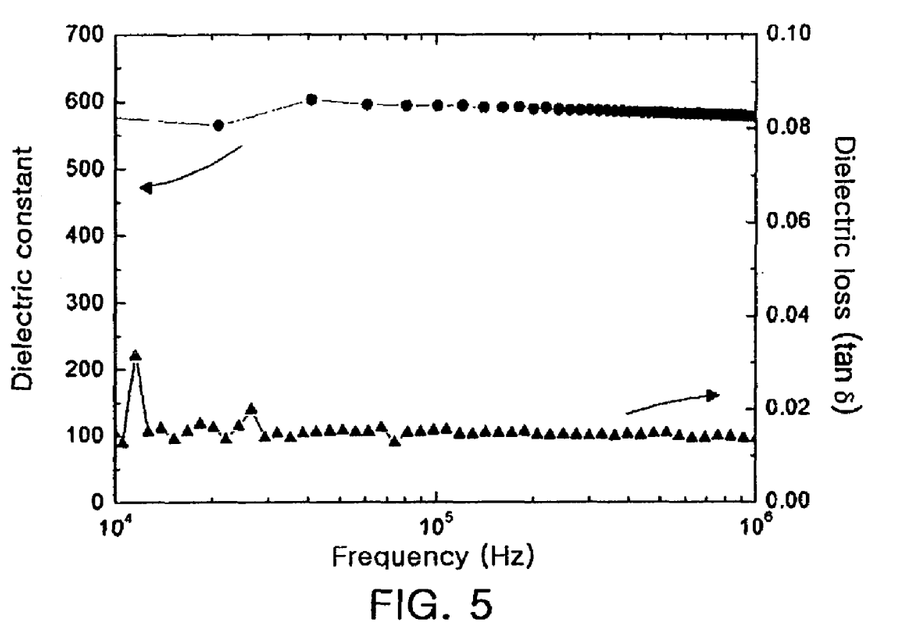
FIG. 5 is a graph illustrating dielectric properties of a PZT film transferred onto a PCB by excimer laser lift-off.

FIG. 5 is a graph illustrating change in dielectric constant of a thin film capacitor embedded in the PCB substrate manufactured as above with respect to a frequency. As shown in FIG. 5, the PZT film transferred onto the PCB exhibits a dielectric constant ranging from 1 MHz to 600 MHz. Also, the PZT film assures a high capacitance of 1.3 μF/cm$^2$ (film thickness 0.4 micrometer), much higher than 0.2 μF/cm$^2$ to 0.3 μF/cm$^2$ (FIG. 1) which is obtained from a ferroelectric film on a copper foil.

Figure 6:
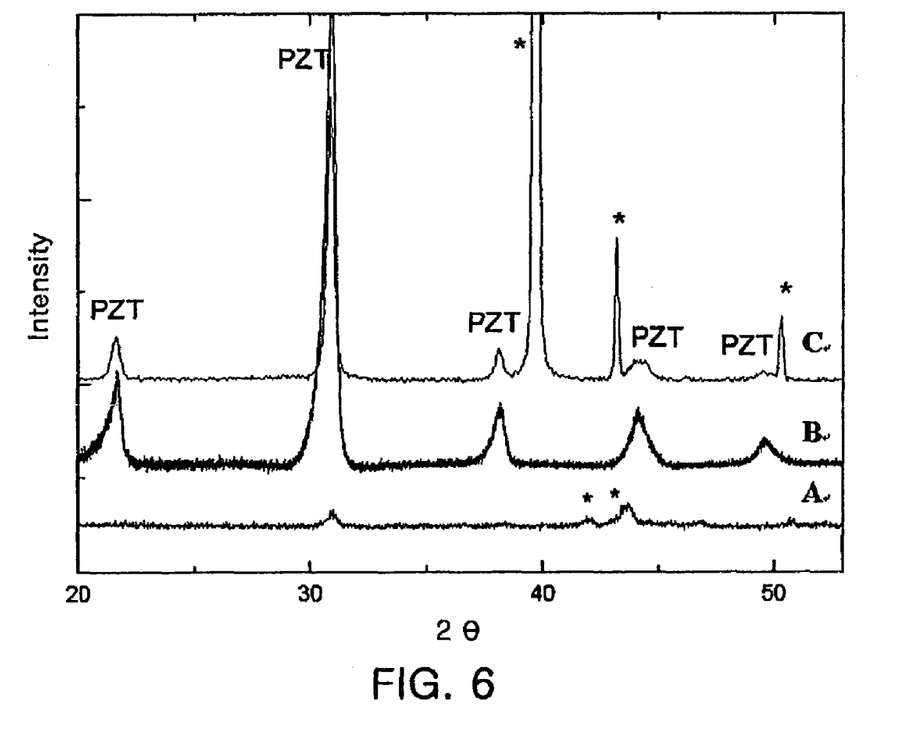
FIG. 6 is a graph illustrating a X-ray diffraction analysis of a dielectric film deposited on a copper foil, a dielectric film deposited on a sapphire, and a PZT thin film transferred onto a polymer/CCL material by excimer laser lift-off, respectively.

FIG. 6 is a graph illustrating an x-ray diffraction pattern of a PZT dielectric film (0.6 micrometer). In FIG. 6, A indicates XRD of a PZT film on a copper foil, B indicates XRD of a PZT film deposited on a sapphire substrate, and C indicates XRD of a PZT film on a sapphire substrate transferred onto ABF/CCL by laser lift-off. Here, heat-treatment was performed in the air at a temperature of 650° C. and for 30 minutes.

As noted from FIG. 6, the PZT film on the copper foil is degraded in crystallinity due to decline in interface properties resulting from oxidation of the copper foil. In contrast, the PZT film on the sapphire substrate exhibits very good crystallinity. Also, the PZT film transferred by laser lift off shows a similar XRD pattern, maintaining good crystallinity.

Figure 7:
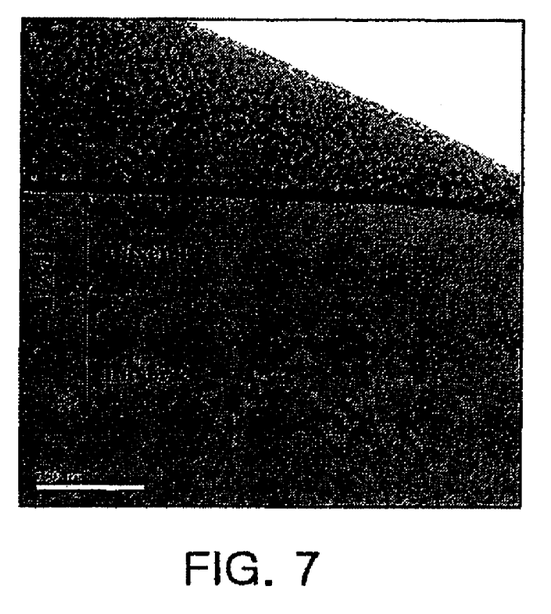
FIG. 7 is a TEM picture illustrating a cross-section of a PZT thin film transferred onto a polymer/CCL material by excimer laser lift-off, which has a laser-induced amorphous layer and a dielectric layer formed thereon.

To determine changes in the PZT films irradiated with laser beam, cross-sections of the PZT films that underwent laser lift-off were observed with a transmission electron microscope (TEM), whose results are illustrated in FIG. 7. As shown in FIG. 7, a PZT film is constructed of two layers (layer 1 and layer 2) after being irradiated with laser beam. The layer 1 is a laser-damaged layer with a thickness of about 108 nm. The layer 1 features a diffused ring, which is characteristic of an amorphous phase, in the electron diffraction pattern. The layer 1 was observed to be amorphous in the high resolution TEM image. Meanwhile, the layer 2 inside the PZT film was observed to have an electron diffraction pattern indicative of a tetragonal crystal structure. The layer 2 also exhibited a tetragonal crystal structure in the high resolution TEM image.

Due to presence of this amorphous layer, as shown in FIG. 7, the PZT thin film transferred onto the PCB according to the invention showed a dielectric constant ranging from 1 MHz to 600 MHz, lower than that (1600 to 1700) of a general PZT film. Here, the PZT thin film was amorphous.

However, in this invention, this amorphous damaged layer is removed by various methods such as wet etching and ion beam milling, thereby elevating its dielectric constant to from 1600 to 1700.

Figure 8:
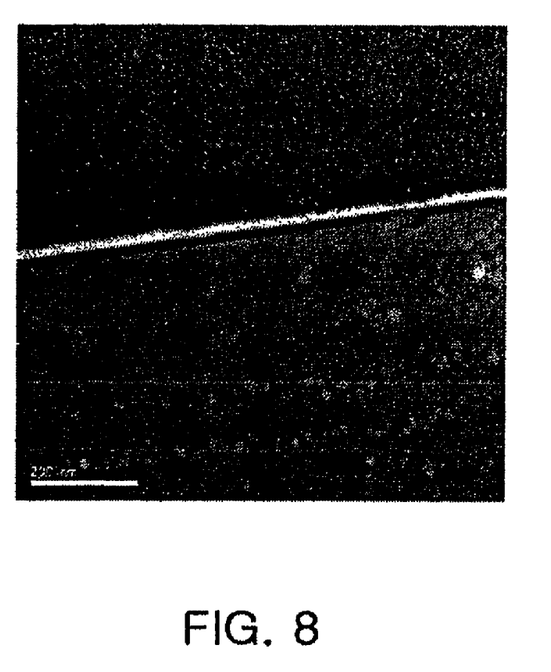
FIG. 8 is a TEM picture illustrating a cross-section of a PZT thin film transferred onto a polymer/CCL material by Femto laser lift-off, in which the PZT film maintains a tetragonal crystal structure even after laser irradiation.

Meanwhile, a capacitor with a structure of a metal conductive layer/dielectric layer/metal conductive layer was formed under the same conditions as described above except that the sapphire substrate was separated by a Femto laser (800 nm, 300 fs). Moreover, to determine changes in the PZT films irradiated with laser beam, cross-sections of the PZT films that underwent laser lift-off were observed with a transmission electron microscope (TEM), the pictures of which are shown in FIG. 8. As seen from FIG. 8, in a case where the sapphire substrate was separated by a Femto laser, the PZT films obtained had tetragonal crystal structures, thereby maintaining crystallinity of the PZT material.

Figure 9:
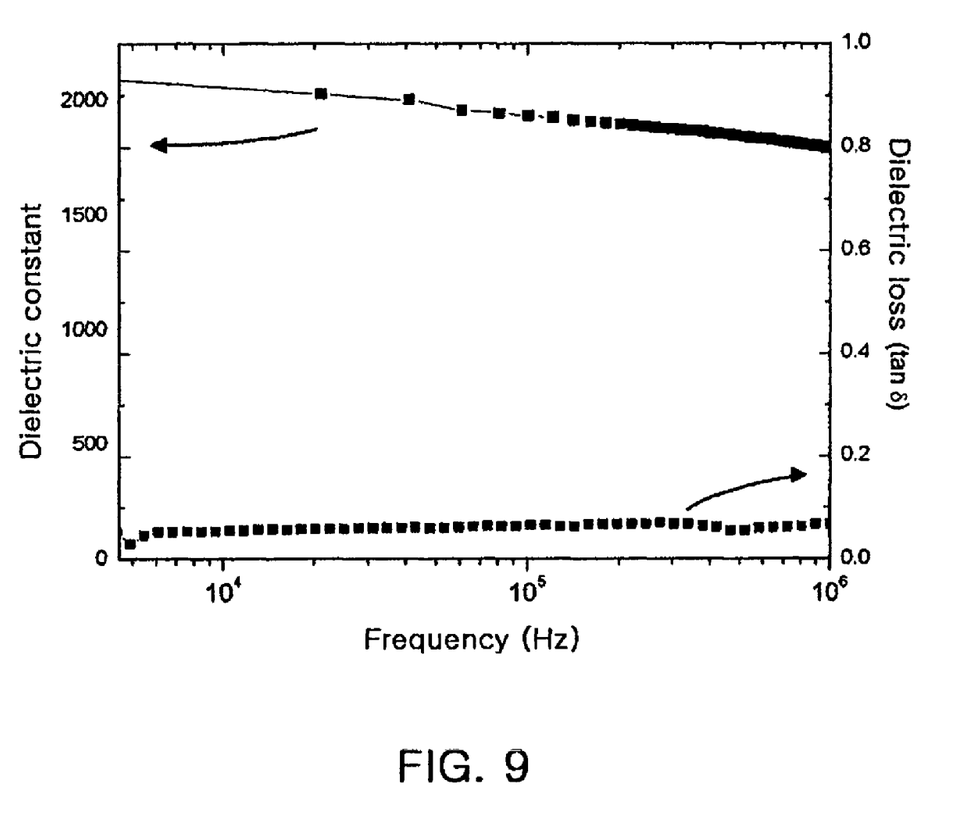
FIG. 9 is a graph illustrating dielectric properties of a PZT thin film transferred onto a PCB by Femto laser lift-off.

FIG. 9 is a graph illustrating a dielectric constant of a PZT film transferred onto a PCB substrate using a Femto laser with respect to a frequency. The PZT film exhibits a superior dielectric constant ranging from 1 MHz to 1600 MHz.

As set forth above, according to exemplary embodiments of the invention, a printed circuit board with a thin film capacitor embedded therein has a dielectric film using laser lift off without obstructing a general PCB process. In addition, the invention overcomes a conventional problem of oxidation of a copper foil.

While the present invention has been shown and described in connection with the preferred embodiments, it will be apparent to those skilled in the art that modifications and variations can be made without departing from the spirit and scope of the invention as defined by the appended claims.

What is claimed is:

1. A method for manufacturing a printed circuit board with a thin film capacitor embedded therein, the method comprising:
    forming a dielectric film on a transparent substrate and heat-treating the dielectric film to form a capacitor;
    forming a first conductive layer on the heat-treated dielectric film;
    stacking a resin coated copper (RCC) film on the conductive layer;
    irradiating a laser beam onto a stack formed, from below the transparent substrate, to separate the transparent substrate from the stack;
    after the transparent substrate is separated from the stack, forming a second conductive layer with a predetermined pattern on the dielectric film; and
    forming an insulating layer and a third conductive layer on the RCC film and the second conductive layer to alternate with each other in a predetermined number.

2. The method according to claim 1, wherein the transparent substrate comprises one selected from a group consisting of sapphire, quartz, glass, MgO, lanthanum aluminate, fused silica and zirconia.

3. The method according to claim 1, wherein the dielectric film comprises one dielectric composition selected from a group consisting of lead zirconium titanate, barium titanate, strontium bismuth tantalate, bismuth lanthanum titanate, lead magnesium niobate-lead titanate, and lead zinc niobate-lead titanate.

4. The method according to claim 3, wherein the dielectric film further comprises a dopant added to the dielectric composition.

5. The method according to claim 1, wherein at least one of the first, second and third conductive layers comprises one selected from a group consisting of Au, Ag, Ni, Cu, Al, Pt, Ti, Ir, IrO.sub.2, Ru, and RuO.sub.2.

6. The method according to claim 1, wherein at least one of the first, second and third conductive layers is formed by a process selected from a group consisting of PVD, CVD, ALD, screen printing, plating and inkjet printing.

7. The method according to claim 6, wherein at least one of the first, second and third conductive layers is formed by the PVD using sputtering or e-beam.

8. The method according to claim 1, wherein at least one of the first, second and third conductive layers is formed by forming a seed layer by PVD and electrolytically plating the seed layer.

9. The method according to claim 1, wherein the transparent substrate is separated from the stack by an excimer laser or an Nd YAG laser.

10. The method according to claim 9, further comprising: after separating the transparent substrate, removing an amorphous damaged layer formed on a top surface of the dielectric film, which is caused by heat of the laser.

11. The method according to claim 1, wherein the transparent substrate is separated from the stack by a Femto laser.

12. The method according to claim 1, further comprising: after forming the dielectric film, forming a bonding layer or a barrier layer on the dielectric film.

13. The method according to claim 12, wherein the step of forming the bonding layer or the barrier layer comprises sputtering Ti or Cr.

14. A printed circuit board with a thin film capacitor embedded therein manufactured as described in claim 1.

15. The method according to claim 1, further comprising:
    forming an insulating layer on the first conductive layer after forming the first conductive layer; and
    stacking a copper clad laminate on the insulating layer.

16. The method according to claim 15, wherein the copper clad laminate includes an insulating member and copper foils attached to a top surface and a bottom surface of the insulating member.

* * * * *